(12) United States Patent  
Nishimura et al.

(10) Patent No.: US 10,845,414 B2  
(45) Date of Patent: Nov. 24, 2020

(54) SEMICONDUCTOR PRODUCT QUALITY MANAGEMENT SERVER, SEMICONDUCTOR DEVICE, AND SEMICONDUCTOR PRODUCT QUALITY MANAGEMENT SYSTEM

(71) Applicant: RENESAS ELECTRONICS CORPORATION, Tokyo (JP)

(72) Inventors: Kazuhiro Nishimura, Tokyo (JP); Yoshiyuki Matsumoto, Tokyo (JP); Naoki Yamada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/447,529

(22) Filed: Jun. 20, 2019

(65) Prior Publication Data

US 2020/0003832 A1 Jan. 2, 2020

(30) Foreign Application Priority Data

Jun. 28, 2018 (JP) .................................. 2018-122648

(51) Int. Cl.
*G01R 31/3177* (2006.01)
*G01R 31/317* (2006.01)

(52) U.S. Cl.
CPC ... *G01R 31/3177* (2013.01); *G01R 31/31718* (2013.01)

(58) Field of Classification Search
CPC ...... G01R 31/26; G01R 31/28; G01R 31/317; G01R 31/3177; G01R 31/3178; G01R 31/31707; G01R 31/2851
See application file for complete search history.

(56) References Cited

U.S. PATENT DOCUMENTS 9,747,998 B2 * 8/2017 Kim .................... G11C 29/027
2015/0066417 A1 * 3/2015 Kimura ............... G06F 11/2294
702/123

FOREIGN PATENT DOCUMENTS

JP 2005-149170 A 6/2005

* cited by examiner

*Primary Examiner* — Shelly A Chase
(74) *Attorney, Agent, or Firm* — McDermott Will & Emery LLP

(57) ABSTRACT

An additional test pattern acquiring unit acquires a test pattern, which is not yet executed to the semiconductor device serving as a target of executing an additional test among test patterns stored in a test pattern information DB, as an additional test pattern with reference to a semiconductor manufacturing history information DB. Also, an additional test transmitting unit transmits the additional test pattern acquired by the additional test pattern acquiring unit to the semiconductor device serving as the target of the additional test through a network. An additional test result acquiring unit acquires a test execution result together with an ID of the semiconductor device, and a registration unit registers identification information of the executed test pattern, an execution result of the test pattern, and an execution timing of the test in a semiconductor product history information DB so as to be associated with the acquired ID of the semiconductor device.

7 Claims, 5 Drawing Sheets

SEMICONDUCTOR PRODUCT QUALITY MANAGEMENT SERVER, SEMICONDUCTOR DEVICE, AND SEMICONDUCTOR PRODUCT QUALITY MANAGEMENT SYSTEM

CROSS-REFERENCE TO RELATED APPLICATION

The present application claims priority from Japanese Patent Application No. 2018-122648 filed on Jun. 28, 2018, the content of which is hereby incorporated by reference into this application.

TECHNICAL FIELD OF THE INVENTION

The present invention relates to a semiconductor product quality management server, a semiconductor device, and a semiconductor product quality management system.

BACKGROUND OF THE INVENTION

In order to reduce the initial failure rate of semiconductor products in the market to a certain level or less, semiconductor product manufacturers perform appropriate screening to semiconductor products before shipping the semiconductor products to customers.

By performing this screening, the semiconductor products having initial failures due to manufacturing defects and those causing failures in the aging degradation failure mode are excluded in advance by semiconductor product manufacturers before shipping to customers, so that the failure rate of the semiconductor products can be suppressed to a value lower than a certain level.

In addition, the pre-shipment test using the testing apparatus described in Japanese Patent Application Laid-Open Publication No. 2005-149170 (Patent Document 1) is executed in order to determine the semiconductor products whose failure becomes apparent in the functional failure mode as defective products and exclude them in advance in the semiconductor product manufactures before shipment to customers.

SUMMARY OF THE INVENTION

It is desirable to make the failure detection rate be as close to 100% as possible before shipment, but it is a reality that the market failure rate (quality reliability standard) is assumed and tests are executed based on the market failure rate before the shipment. Namely, semiconductor products having untested nodes (even slightly) are shipped. For this reason, it is desirable to further increase the failure detection rate after the shipment of semiconductor devices.

Other objects and novel features will be apparent from the description of the present specification and the accompanying drawings.

The following is a brief description of an outline of the typical embodiment disclosed in the present application.

A semiconductor product quality management server according to an embodiment that manages a quality of a semiconductor device mounted in a final product comprises: a history storage unit configured to store test history information in which identification information of the semiconductor device and a test execution history before shipment of the semiconductor device are associated with each other; a test pattern storage unit configured to store information of test patterns; an additional test pattern acquiring unit configured to acquire a test pattern, which is not yet executed to the semiconductor device serving as a target of executing an additional test among the test patterns stored in the test pattern storage unit, as an additional test pattern with reference to the history storage unit; an additional test transmitting unit configured to transmit the additional test pattern acquired by the additional test pattern acquiring unit to the semiconductor device; an additional test result acquiring unit configured to acquire an execution result of the additional test pattern transmitted by the additional test transmitting unit from the semiconductor device; and an execution result registration unit configured to register the execution result acquired by the additional test result acquiring unit in the history storage unit.

According to the embodiment mentioned above, it is possible to increase the failure detection rate even after the shipment of semiconductor devices.

BRIEF DESCRIPTIONS OF THE DRAWINGS

DESCRIPTIONS OF THE PREFERRED EMBODIMENTS

Figure 1:
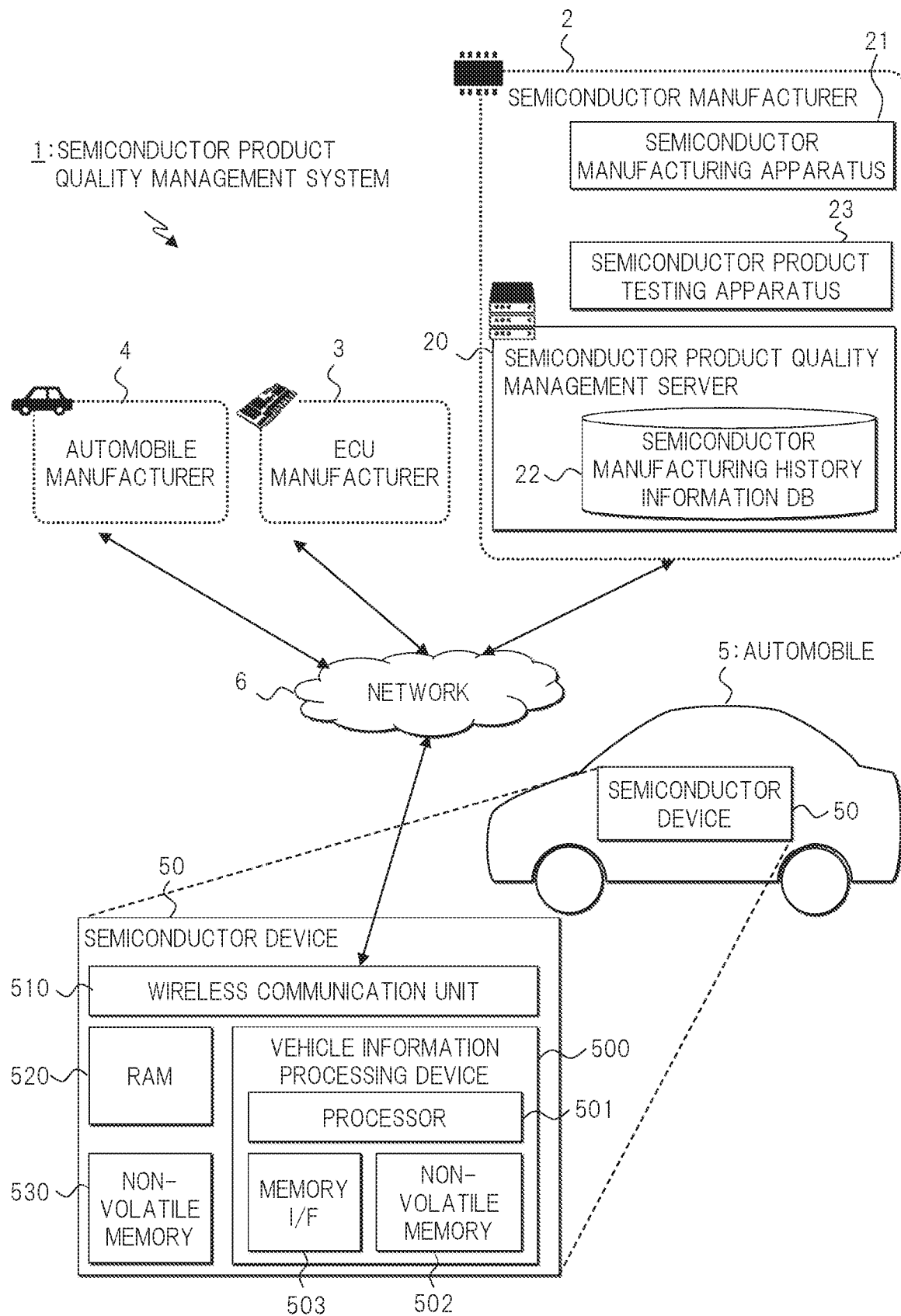
FIG. 1 is a diagram schematically showing a configuration example of a semiconductor product quality management system according to a present embodiment.

Hereinafter, an embodiment of the present invention will be described in detail with reference to the accompanying drawings. Note that the same components are denoted by the same reference characters throughout the drawings for describing the embodiment, and the repetitive description thereof will be omitted. Meanwhile, a component that has been denoted by a reference character and described in a certain drawing may be mentioned with the same reference character in the description of another drawing in some cases though not illustrated again.

<System Configuration>

FIG. 1 is a diagram schematically showing a configuration example of a semiconductor product quality management system according to a present embodiment. A semiconductor product quality management system 1 according to the present embodiment is an information processing system configured to make a semiconductor device 50 (semiconductor device that has been shipped) mounted in an automobile 5 (final product) execute an additional test.

The semiconductor product quality management system 1 includes, for example, a semiconductor product quality management server 20 of a semiconductor manufacturer 2 and the semiconductor device 50 mounted in the automobile 5, and has a configuration in which these are connectable and communicable through a network 6 such as the Internet.

The semiconductor product quality management server 20 is a server apparatus that manages the quality of the semiconductor device 50 mounted in the final product. The semiconductor product quality management server 20 is a server system configured of, for example, a server device or a virtual server constructed on the cloud computing service.

For example, various functions to be described later are realized by executing middleware such as OS (Operating System (not shown)), DBMS (DataBase Management System (not shown)), and the Web server program and software operating thereon by the CPU (Central Processing Unit (not shown)). Also, the semiconductor product quality management server 20 includes a semiconductor manufacturing history information DB 22.

An enormous amount of information relating to the manufacturing history of each semiconductor device 50 manufactured by a semiconductor manufacturing apparatus 21 is stored and accumulated in the semiconductor manufacturing history information DB 22 (history storage unit). In this case, various kinds of manufacturing history information relating to factory, manufacture, material, test, inspection, apparatus and others are stored so as to be associated with individual identification information such as ID uniquely assigned and written to the semiconductor device 50.

As described above, the semiconductor manufacturing history information DB 22 stores the information in which the identification information of the semiconductor device 50 and the test execution history before the shipment of the semiconductor device 50 are associated with each other.

In addition, the semiconductor manufacturing history information DB 22 also stores information of test execution state (test history information). For example, the semiconductor manufacturing history information DB 22 stores the ID of the semiconductor device 50, information indicating an executed test pattern (identification information of test pattern), an execution timing of test (information indicating pre-shipment or post-shipment), and an execution result so as to be associated with each other. Further, the semiconductor manufacturing history information DB 22 stores the ID (identification information) of the semiconductor device 50 and the state of the semiconductor device 50 so as to be associated with each other.

The manufacturing history information stored in the semiconductor manufacturing history information DB 22 is the data that is usually unitarily managed by the semiconductor manufacturer 2 and is used only inside the semiconductor manufacturer without being published to outside. Note that the semiconductor manufacturing history information DB 22 may be unitarily managed by the database server or the like or all or a part of the data thereof (or replica thereof) may be retained in the semiconductor product quality management server 20.

Each of an ECU manufacturer 3 and an automobile manufacturer 4 may be independently provided with the mechanism in the semiconductor manufacturer 2 mentioned above.

For example, the semiconductor device 50 in each automobile 5 is mounted as a component of an interior of a driver's seat in a state of being incorporated in the ECU or the like. Therefore, the semiconductor device 50 has also the function of performing the input/output and the control of various meters and instruments in a dash board or an instrument panel, but only the main parts relating to the present embodiment are described in the example of FIG. 1.

For example, the semiconductor device 50 is configured as a package including a plurality of semiconductor integrated circuits fabricated on a silicon chip, and includes a vehicle information processing device 500, a wireless communication unit 510, a RAM (Random Access Memory) 520, a non-volatile memory 530 and others. The non-volatile memory 530 is configured of, for example, FMONOS (Flash Metal Oxide Nitride Oxide Semiconductor) and an electronic fuse. Note that the semiconductor device 50 may include various sensors (for example, temperature sensor) or may acquire information from various sensors.

The vehicle information processing device 500 has the function of inputting and processing various kinds of information relating to the automobile 5 and outputting the control information and the like, and further includes a processor 501, a non-volatile memory 502, a memory interface (I/F) 503 and others. The processor 501 accesses various memories such as the non-volatile memory 502 in the vehicle information processing device 500, the external non-volatile memory 530, the RAM 520 and the like through the memory I/F 503, and performs the program execution and the data input/output processing.

For example, the wireless communication unit 510 has the function of communicating with the semiconductor product quality management server 20 through an external antenna mechanism (not shown) and the network 6 by the function of a near field communication such as the Wi-Fi (registered trademark) or Bluetooth (registered trademark) and a 4G mobile communication such as LTE (Long Term Evolution).

The wireless communication unit 510 acquires the test pattern (for example, additional test pattern) through the network 6 and transmits the result of the test (output pattern) executed by the vehicle information processing device 500 and the ID of its own device to the semiconductor product quality management server 20.

In addition, the semiconductor device 50 determines whether its own device is in a state of being able to execute the test, and transmits the determination result to the semiconductor product quality management server 20. For example, if the automobile 5 is traveling, it is determined that the test cannot be executed, and if the automobile 5 is in a state of being stopped for a long time, it is determined that the test can be executed.

Among them, the test execution function for executing the test based on the test pattern generally provided in the semiconductor device 50 is also included.

Note that the semiconductor product quality management server 20 may regularly transmit the additional test pattern to each semiconductor device 50 or may irregularly transmit the additional test pattern to each semiconductor device 50.

<Manufacturing Method of Semiconductor Device>

Figure 2:
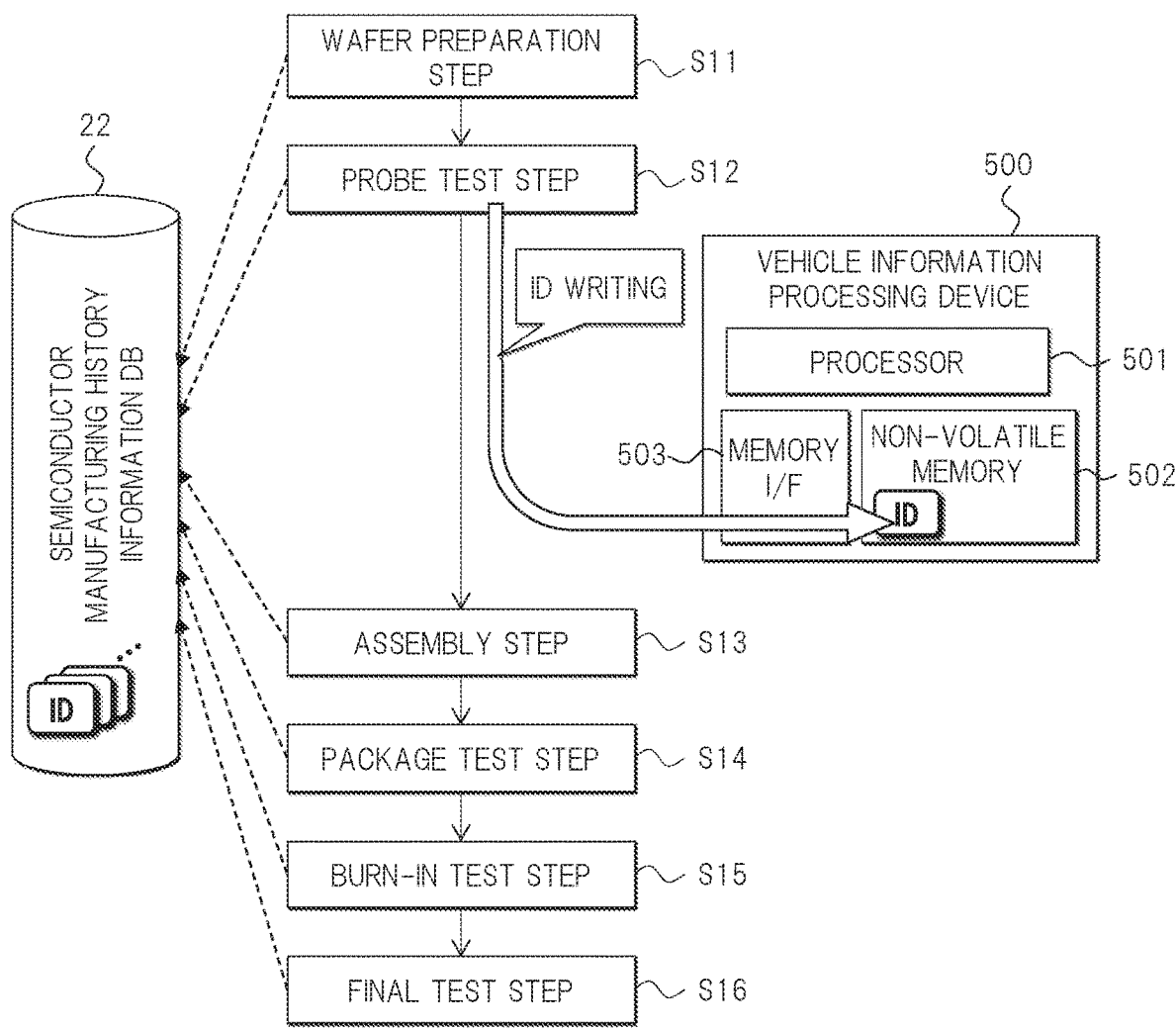
FIG. 2 is a flowchart schematically showing an example of a manufacturing method of a semiconductor device 50 according to the present embodiment.

FIG. 2 is a flowchart schematically showing an example of a manufacturing method of the semiconductor device 50 according to the present embodiment. First, as a pre-process, a semiconductor wafer (hereinafter, referred to simply as "wafer") is prepared in a wafer preparing step (S11). Though not shown, for example, the wafer prepared in this step has an approximately circular planar shape and a main surface (device forming surface) thereof is partitioned into a plurality of chip regions.

In the wafer preparing step (S11), for example, a semiconductor substrate having a main surface is first prepared. Thereafter, a plurality of semiconductor elements such as transistors and diodes are formed on the main surface of the semiconductor substrate. Then, wiring layers are stacked on the main surface of the semiconductor substrate. The plurality of semiconductor elements on the main surface are electrically connected to each other through a plurality of wirings in each of the wiring layers, so that a plurality of semiconductor integrated circuits are formed on a main surface side of the wafer. Thereafter, a protective film (passivation film, insulating film) is formed so as to cover the wiring layers. By these processes, the wafer having a plurality of regions of the semiconductor chips (hereinafter, referred to simply as "chip") in which the integrated circuits constituting the semiconductor device 50 are formed is obtained.

When the wafer has been prepared, next, electrical test using a probe card or probe inspection apparatus is executed for the chips formed on the wafer in a probe test (wafer test) step (S12). The unique ID is assigned to each chip determined as a good product in this test and the ID is written in the non-volatile memory 502 or the non-volatile memory 530 in the chip. The example of FIG. 2 shows the case in which the ID is written in the non-volatile memory 502 in the vehicle information processing device 500. As described above, the semiconductor device 50 stores the ID of itself. Namely, the non-volatile memory 502 or the non-volatile memory 530 functions as an identification information storage unit.

Next, as a post-process, in an assembly step (S13), the wafer is cut and singulated into respective chip regions (dicing) to obtain the plurality of chips, and the chips determined as good products in the probe test step (S12) are assembled to the package as the semiconductor device 50. Thereafter, according to need, in a package test step (S14), the package electrical test using tester apparatus such as the package probe (semiconductor product testing apparatus 23) is executed for the packaged chips (package product) in order to detect the assembly failure.

Further, in a burn-in test step (S15), the test in the state where the stress is accelerated by applying a high temperature and a high voltage to the package is executed for the package determined as a good product in the package test step (S14). Then, in a final test step (S16), the test about details such as functional and electrical properties is executed for the package determined as a good product in the burn-in test step (S15) by using, for example, the semiconductor product testing apparatus 23. The package determined as a good product in the final test step (S16) is shipped to a semiconductor customer such as the ECU manufacturer 3. Note that the flow shown above is the schematic description of the main process in the process of manufacturing the chip, and various modifications can be applied thereto.

In a series of processes described above, environments and conditions of respective steps and various kinds of information such as process results are all stored as the manufacturing history information in the semiconductor manufacturing history information DB 22 so as to be associated with the information of the ID of each semiconductor device 50 (chip). Therefore, in the semiconductor manufacturer 2, the detailed history of the target semiconductor device 50 can be fully understood with using the ID of the semiconductor device 50 as a key. Further, this ID information is written in the non-volatile memory 502 or the non-volatile memory 530 of the semiconductor device 50 and can be read by the processing of the processor 501.

Note that even the ECU manufacturer 3 or the automobile manufacturer 4 that incorporates the semiconductor device 50 thus manufactured in its product (semiconductor product or final automobile) may independently write identification information such as ID in the non-volatile memory 530 or the like of the semiconductor device 50 in the manufacturing process of each manufacturer.

<Function of Semiconductor Device>

Figure 3:
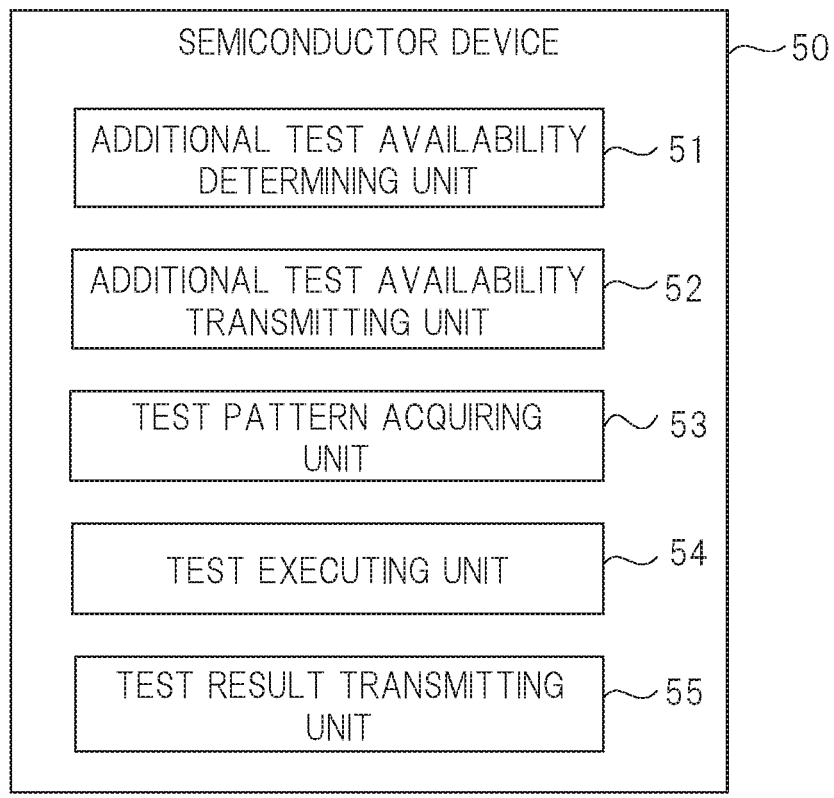
FIG. 3 is a block diagram showing a function of the semiconductor device.

Next, the function of the semiconductor device 50 will be described with reference to FIG. 3. FIG. 3 is a block diagram showing the function of the semiconductor device 50. The semiconductor device 50 includes an additional test availability determining unit 51, an additional test availability transmitting unit 52, a test pattern acquiring unit 53, a test executing unit 54, and a test result transmitting unit 55.

The additional test availability determining unit 51 is a part that determines whether the additional test can be executed or not based on the state of the final product (for example, automobile 5). The additional test availability determining unit 51 detects the traveling state of the automobile 5, and determines that the additional test is impossible if the automobile 5 is traveling. Also, the additional test availability determining unit 51 determines that the additional test is possible if the automobile 5 is stopped for a long time. As described above, the additional test availability determining unit 51 monitors the state of the automobile 5 and determines whether the additional test can be executed or not.

The additional test availability determining unit 51 may be configured to specify the temperature state of the automobile 5 and determine whether the additional test is possible or not based on the temperature state. The additional test availability determining unit 51 transmits the determination result as to whether the additional test is possible or not (information indicating whether the test is possible or not) to the additional test availability transmitting unit 52.

Upon reception of the determination result as to whether the additional test is possible or not from the additional test availability determining unit 51, the additional test availability transmitting unit 52 transmits the result and the ID of the semiconductor device 50 to the semiconductor product quality management server 20.

The test pattern acquiring unit 53 is a part that receives the test pattern from the semiconductor product quality management server 20. This test pattern (pattern data) includes device input data such as the input parameter and device output expectation value data which is an expectation value of the test result. Upon reception of the test pattern, the test pattern acquiring unit 53 transmits the test pattern to the test executing unit 54.

The test executing unit 54 is a part that executes the test based on the acquired test pattern. Upon reception of the test pattern from the test pattern acquiring unit 53, the test executing unit 54 retains the test pattern in a memory buffer. The test executing unit 54 retains the device input data in a pattern memory buffer and retains the device output expectation value in an output expectation value memory buffer.

Also, the test executing unit 54 makes a transition to a test mode. In this test mode, the control to the automobile 5 is not performed according to the input data to the vehicle information processing device 500.

When the transition to the test mode is made, the test executing unit 54 inputs the device input data of the test pattern to the vehicle information processing device 500, and acquires the device output data from the vehicle information processing device 500. Also, the test executing unit 54 logically compares the device output data and the device output expectation value data (comparison in logical value) and retains pattern comparison data obtained by the comparison in a fail memory buffer as the test result data, and then notifies the test result transmitting unit 55 of the completion of the test.

The test result transmitting unit 55 is a part that transmits the test result to the semiconductor product quality management server 20. Upon reception of the notification of the completion of the test, the test result transmitting unit 55 acquires the test result data from the fail memory buffer, and transmits the test result data to the semiconductor product quality management server 20 together with the ID of the semiconductor device 50.

<Function of Semiconductor Product Quality Management Server>

Figure 4:
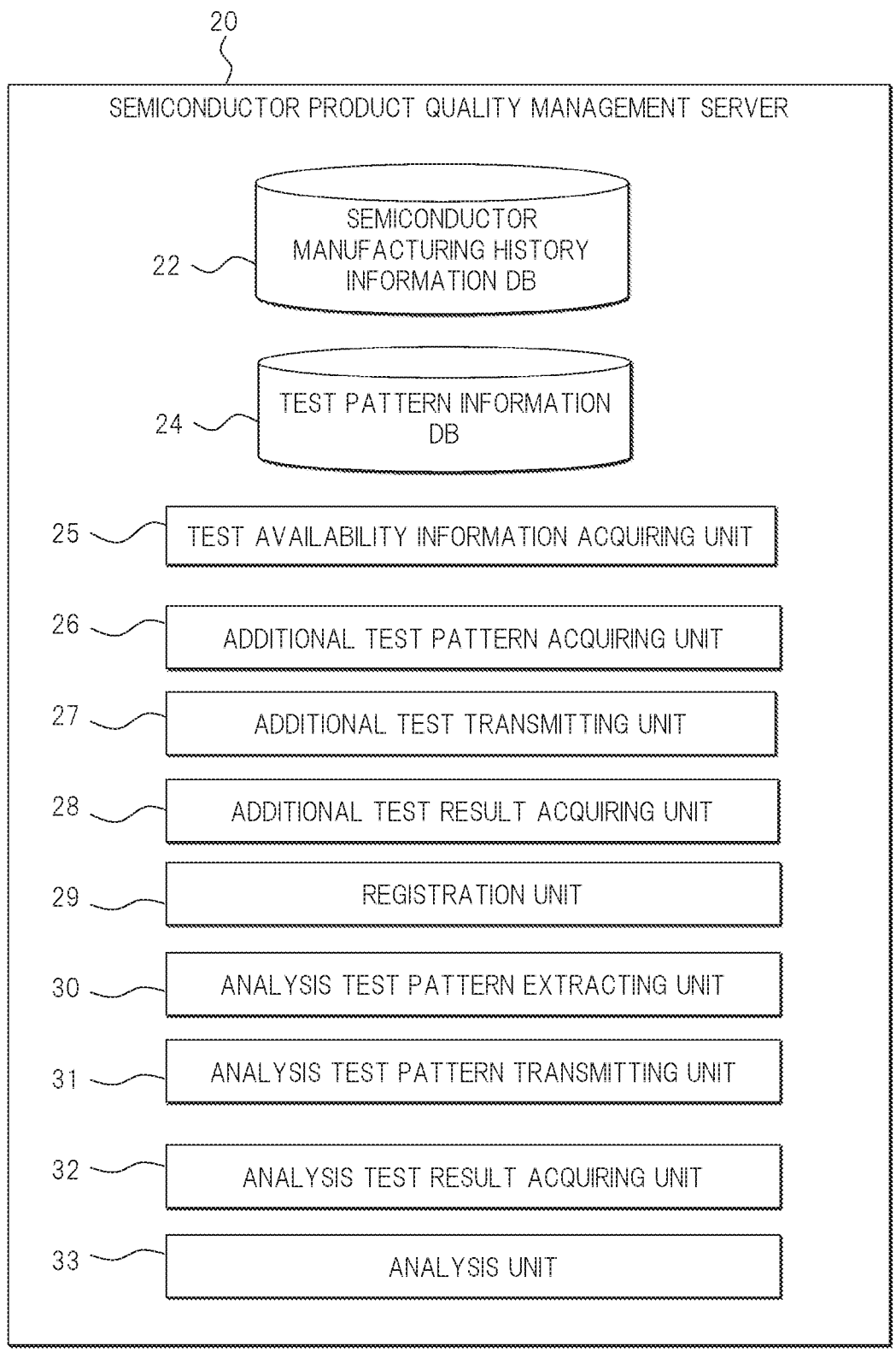
FIG. 4 is a block diagram showing a function of a semiconductor product quality management server.

Next, the function of the semiconductor product quality management server 20 will be described with reference to FIG. 4. FIG. 4 is a block diagram showing the function of the semiconductor product quality management server 20. As shown in FIG. 4, the semiconductor product quality management server 20 includes the semiconductor manufacturing history information DB 22, a test pattern information DB 24 (test pattern storage unit), a test availability information acquiring unit 25, an additional test pattern acquiring unit 26, an additional test transmitting unit 27, an additional test result acquiring unit 28, and a registration unit 29 (execution result registration unit).

The semiconductor product quality management server 20 further includes an analysis test pattern extracting unit 30, an analysis test pattern transmitting unit 31, an analysis test result acquiring unit 32, and an analysis unit 33.

The test pattern information DB 24 is a part that stores the information of the test pattern. The identification information of the test pattern and the pattern data of the test pattern are stored so as to be associated with each other. The pattern data includes the device input data such as the input parameter and the device output expectation value data which is an expectation value of the test result.

The test availability information acquiring unit 25 is a part that acquires the availability information as to whether the additional test can be executed or not from the semiconductor device 50. The test availability information acquiring unit 25 acquires the ID of the semiconductor device 50 and the information indicating whether the test is possible or not from the semiconductor device 50. The test availability information acquiring unit 25 stores the acquired information.

The additional test pattern acquiring unit 26 is a part that acquires the test pattern, which is not executed for the semiconductor device 50 serving as a target of executing the additional test among the test patterns stored in the test pattern information DB 24, as the additional test pattern with reference to the semiconductor manufacturing history information DB 22.

The additional test pattern acquiring unit 26 sets the semiconductor device 50, to which the additional test can be executed according to the availability information acquired by the test availability information acquiring unit 25, as the semiconductor device 50 serving as a target of the additional test at a certain timing (predetermined timing). The additional test pattern acquiring unit 26 acquires the test pattern, which is not yet executed to the semiconductor device 50 serving as the target of the additional test among the test patterns stored in the test pattern information DB 24, as the additional test pattern from the test pattern information DB 24 with reference to the semiconductor manufacturing history information DB 22.

The additional test pattern acquiring unit 26 transmits the ID of the semiconductor device 50 serving as the target of the additional test and the additional test pattern to the additional test transmitting unit 27.

The additional test transmitting unit 27 is a part that transmits the additional test pattern acquired by the additional test pattern acquiring unit 26 to the semiconductor device 50 serving as the target of the additional test.

Upon reception of the ID of the semiconductor device 50 serving as the target of the additional test and the additional test pattern from the additional test pattern acquiring unit 26, the additional test transmitting unit 27 transmits the additional test pattern to the semiconductor device 50 serving as the target of the additional test. Note that the additional test transmitting unit 27 transmits the additional test pattern to the semiconductor device 50 serving as the target of the additional test under the condition that the information indicating the test availability transmitted by the semiconductor device 50 serving as the target of the additional test indicates that the test can be executed.

The additional test result acquiring unit 28 is a part that acquires the execution result of the additional test pattern transmitted by the additional test transmitting unit 27. The additional test result acquiring unit 28 acquires, from the semiconductor device 50 to which the additional test pattern is executed, the ID of the semiconductor device 50 and the execution result of the additional test pattern. The additional test result acquiring unit 28 transmits the ID of the semiconductor device 50 and the execution result of the additional test pattern thus acquired to the registration unit 29.

The registration unit 29 is a part that registers the information based on the execution result acquired by the additional test result acquiring unit 28. The registration unit 29 acquires the ID of the semiconductor device 50 and the execution result of the additional test pattern from the additional test result acquiring unit 28. The registration unit 29 registers the identification information of the executed test pattern, the execution result of the test pattern, and the execution timing of the test (for example, information indicating post-shipment) in the semiconductor manufacturing history information DB 22.

The analysis test pattern extracting unit 30 is a part that extracts the executed test pattern from the semiconductor manufacturing history information DB 22 when the result acquired by the additional test result acquiring unit 28 is not a normal result. The executed test pattern mentioned here means the test pattern that has been executed before the shipment. When the result acquired by the additional test result acquiring unit 28 is not a normal result, the analysis test pattern extracting unit 30 extracts the analysis test pattern by acquiring the test pattern ID (identification information of test pattern) of any of test patterns, which corresponds to the ID of the semiconductor device 50 which has transmitted the abnormal result, the execution timing of which is pre-shipment, and which has already been executed (normal result), with reference to the semiconductor manufacturing history information DB 22.

The analysis test pattern extracting unit 30 acquires the test pattern corresponding to the extracted test pattern ID with reference to the test pattern information DB 24 and transmits the ID of the semiconductor device 50 which has transmitted the abnormal result and the test pattern to the analysis test pattern transmitting unit 31.

The analysis test pattern transmitting unit 31 is a part that transmits the test pattern extracted by the analysis test pattern extracting unit 30 to the semiconductor device 50 as the analysis test pattern. Upon reception of the ID of the semiconductor device 50 and the test pattern from the analysis test pattern extracting unit 30, the analysis test pattern transmitting unit 31 transmits the test pattern to the semiconductor device 50 corresponding to the acquired ID.

The analysis test result acquiring unit 32 is a part that acquires the execution result of the test pattern transmitted from the analysis test pattern transmitting unit 31. The analysis test result acquiring unit 32 acquires, from the semiconductor device 50 to which the analysis test pattern is executed, the ID of the semiconductor device 50 and the execution result of the analysis test pattern. The analysis test result acquiring unit 32 transmits the ID of the semiconductor device 50 and the execution result of the analysis test pattern thus acquired to the analysis unit 33.

The analysis unit 33 is a part that analyzes the state of the semiconductor device 50 based on the execution result acquired by the analysis test result acquiring unit 32. The analysis unit 33 acquires the ID of the semiconductor device 50 and the execution result of the analysis test pattern from the analysis test result acquiring unit 32.

When indicating that the execution result is not normal with reference to the execution result of the analysis test pattern, the analysis unit 33 analyzes that it is the degradation failure mode (due to degradation) caused by the manufacturing defect of the semiconductor device 50.

Further, when indicating that the execution result is normal with reference to the execution result of the analysis test pattern, the analysis unit 33 analyzes that it is the failure mode different from the failure detection target node of the test pattern used for the pre-shipment test of the semiconductor device 50. The analysis unit 33 registers the analysis result as the state of the semiconductor device 50 so as to be associated with the ID of the semiconductor device 50.

<Process Flow>

Figure 5:
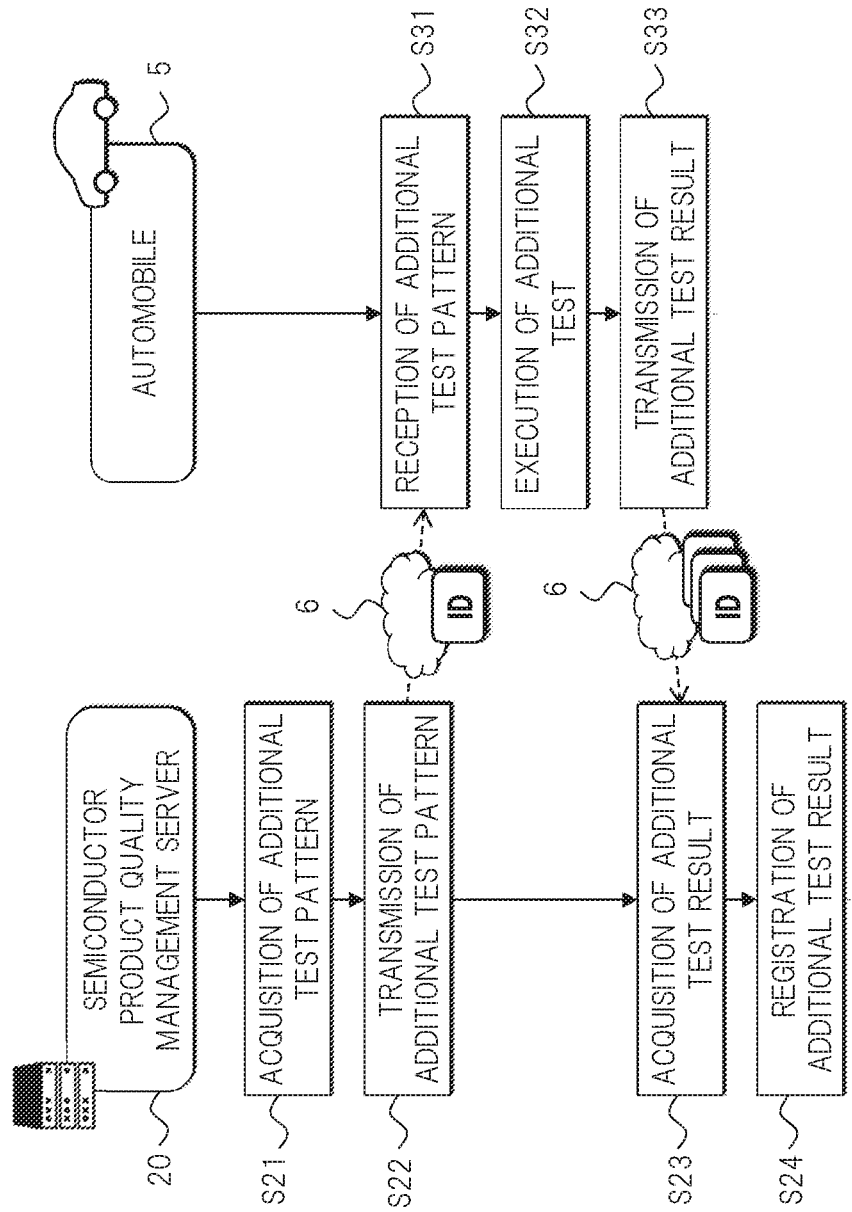
FIG. 5 is a flowchart showing a procedure for executing an additional test pattern.

Next, the procedure for executing the additional test pattern will be described with reference to the flowchart shown in FIG. 5. FIG. 5 is a flowchart showing the procedure for executing the additional test pattern. The additional test pattern acquiring unit 26 acquires the test pattern, which is not yet executed to the semiconductor device 50 serving as the target of executing the additional test among the test patterns stored in the test pattern information DB 24, as the additional test pattern with reference to the semiconductor manufacturing history information DB 22 (step S21).

The additional test transmitting unit 27 transmits the additional test pattern acquired by the additional test pattern acquiring unit 26 to the semiconductor device 50 serving as the target of the additional test through the network 6 (step S22). The semiconductor device 50 receives the additional test pattern (step S31). The semiconductor device 50 executes the additional test based on the additional test pattern (step S32). The semiconductor device 50 transmits the test execution result (additional test result) to the semiconductor product quality management server 20 through the network 6 together with the ID of the semiconductor device 50 (step S33).

The additional test result acquiring unit 28 acquires the additional test result together with the ID of the semiconductor device 50 (step S23). The registration unit 29 registers the identification information of the executed test pattern, the execution result of the test pattern, and the execution timing of the test in the semiconductor manufacturing history information DB 22 so as to be associated with the acquired ID of the semiconductor device 50 (step S24).

<Functional Effect>

The additional test pattern acquiring unit 26 acquires the test pattern, which is not yet executed to the semiconductor device 50 serving as the target of executing the additional test among the test patterns stored in the test pattern information DB 24, as the additional test pattern with reference to the semiconductor manufacturing history information DB 22. Also, the additional test transmitting unit 27 transmits the additional test pattern acquired by the additional test pattern acquiring unit 26 to the semiconductor device 50 serving as the target of the additional test through the network 6. The additional test result acquiring unit 28 acquires the test execution result together with the ID of the semiconductor device 50, and the registration unit 29 registers the identification information of the executed test pattern, the execution result of the test pattern, and the execution timing of the test in the semiconductor manufacturing history information DB 22 so as to be associated with the acquired ID of the semiconductor device 50.

As described above, the semiconductor product quality management server 20 transmits the test pattern which is not yet executed to the semiconductor device 50 after the shipment, makes the semiconductor device 50 execute the test pattern, and acquires and registers the execution result thereof. Accordingly, since it is possible to execute the test pattern which is not yet executed to the semiconductor device 50 after the shipment, the failure detection rate can be increased even after the shipment of the semiconductor device 50.

Also, when the execution result acquired from the semiconductor device 50 is not the normal result, the analysis test pattern extracting unit 30 extracts the test pattern, which has already been executed, from the semiconductor manufacturing history information DB 22 as the analysis test pattern, transmits the analysis test pattern to the semiconductor device 50, and makes the semiconductor device 50 execute the analysis test pattern. In addition, the analysis test result acquiring unit 32 acquires the result of the analysis test pattern, and the analysis unit 33 analyzes the state of the semiconductor device 50 based on the result of the analysis test pattern. Accordingly, it is possible to suitably analyze the reason why the result of the additional test pattern is not normal.

Further, the test availability information acquiring unit 25 acquires the test availability information from the semiconductor device 50, and the additional test transmitting unit 27 transmits the additional test pattern to the semiconductor device 50 which has transmitted the test availability information indicating that the additional test can be executed. As described above, since the semiconductor product quality management server 20 transmits the additional test pattern to only the semiconductor device 50 which can execute the additional test, it is possible to prevent the additional test pattern from being transmitted unnecessarily.

Also, the additional test pattern acquiring unit 26 may be configured to preferentially acquire the additional test pattern, which indicates that the additional test pattern executed in another semiconductor device 50 is not normal, as the additional test pattern with reference to the semiconductor manufacturing history information DB 22.

As described above, the additional test pattern acquiring unit 26 may be configured to determine the additional test pattern based on the execution state of another semiconductor device 50 with reference to the semiconductor manufacturing history information DB 22. In this case, the semiconductor product quality management server 20 can set the test whose failure detection rate is assumed to be high as the additional test pattern.

In the foregoing, the invention made by the inventors of the present invention has been concretely described based on the embodiment. However, it is needless to say that the present invention is not limited to the foregoing embodiment and various modifications and alterations can be made within the scope of the present invention. For example, the embodiment above has been described in detail so as to make the present invention easily understood, and the present invention is not always limited to the embodiment having all of the described constituent elements. Also, another configuration may be added to a part of the configuration of the embodiment above, and a part of the configuration of the embodiment may be eliminated or replaced with another configuration.

The present invention is applicable to the apparatus that manages the quality of the semiconductor device.

What is claimed is:

1. A semiconductor product quality management server that manages a quality of a semiconductor device mounted in a final product, the server comprising:
    a history storage unit configured to store test history information in which identification information of the semiconductor device and a test execution history before shipment of the semiconductor device are associated with each other;
    a test pattern storage unit configured to store information of test patterns;
    an additional test pattern acquiring unit configured to acquire a test pattern, which is not yet executed to the semiconductor device serving as a target of executing an additional test among the test patterns stored in the test pattern storage unit, as an additional test pattern with reference to the history storage unit;
    an additional test transmitting unit configured to transmit the additional test pattern acquired by the additional test pattern acquiring unit to the semiconductor device;
    an additional test result acquiring unit configured to acquire an execution result of the additional test pattern transmitted by the additional test transmitting unit from the semiconductor device; and
    an execution result registration unit configured to register the execution result acquired by the additional test result acquiring unit in the history storage unit.

2. The semiconductor product quality management server according to claim 1, further comprising:
    an analysis test pattern extracting unit configured to extract a test pattern, which has already been executed before shipment of the semiconductor device, as an analysis test pattern from the history storage unit when the result acquired by the additional test result acquiring unit is not a normal result;
    an analysis test pattern transmitting unit configured to transmit the analysis test pattern extracted by the analysis test pattern extracting unit to the semiconductor device;
    an analysis test result acquiring unit configured to acquire an execution result of the analysis test pattern transmitted by the analysis test pattern transmitting unit; and
    an analysis unit configured to analyze a state of the semiconductor device based on the execution result acquired by the analysis test result acquiring unit.

3. The semiconductor product quality management server according to claim 1, further comprising:
    an availability information acquiring unit configured to acquire availability information indicating whether an additional test can be executed or not from the semiconductor device,
    wherein the additional test transmitting unit transmits the additional test pattern to the semiconductor device whose availability information acquired by the availability information acquiring unit indicates that the additional test can be executed.

4. The semiconductor product quality management server according to claim 1,
    wherein the additional test pattern acquiring unit determines the additional test pattern based on an execution state of another semiconductor device with reference to the history storage unit.

5. A semiconductor device that is communicable with a semiconductor product quality management server configured to manage a quality of a semiconductor device mounted in a final product through a network and is mounted in each final product, the semiconductor device comprising:
    an identification information storage unit configured to store identification information for identifying its own semiconductor device;
    an additional test pattern acquiring unit configured to acquire an additional test pattern from the semiconductor product quality management server;
    a test executing unit configured to execute the additional test pattern acquired by the additional test pattern acquiring unit; and
    a test result transmitting unit configured to transmit a result of the test executed by the test executing unit to the semiconductor product quality management server.

6. The semiconductor device according to claim 5, further comprising:
    an additional test availability determining unit configured to determine whether the additional test can be executed or not based on a state of the final product; and
    an additional test availability transmitting unit configured to transmit a result of the determination by the additional test availability determining unit to the semiconductor product quality management server.

7. A semiconductor product quality management system comprising:
    a semiconductor product quality management server that manages a quality of a semiconductor device mounted in a final product; and
    a semiconductor device that is mounted in each final product and is communicable with the semiconductor product quality management server through a network,
    wherein the semiconductor product quality management server includes:
        a history storage unit configured to store test history information in which identification information of the semiconductor device and a test execution history before shipment of the semiconductor device are associated with each other;
        a test pattern storage unit configured to store information of test patterns;
        an additional test pattern acquiring unit configured to acquire a test pattern, which is not yet executed to the semiconductor device serving as a target of executing an additional test among the test patterns stored in the test pattern storage unit, as an additional test pattern with reference to the history storage unit;
        an additional test transmitting unit configured to transmit the additional test pattern acquired by the additional test pattern acquiring unit to the semiconductor device;
        an additional test result acquiring unit configured to acquire an execution result of the additional test pattern transmitted by the additional test transmitting unit from the semiconductor device; and
        an execution result registration unit configured to register the execution result acquired by the additional test result acquiring unit in the history storage unit, and
    the semiconductor device includes:
        an identification information storage unit configured to store identification information for identifying its own semiconductor device;

an additional test pattern acquiring unit configured to acquire an additional test pattern from the semiconductor product quality management server;
a test executing unit configured to execute the additional test pattern acquired by the additional test pattern acquiring unit; and
a test result transmitting unit configured to transmit a result of the test executed by the test executing unit to the semiconductor product quality management server.

* * * * *